US008638093B2

(12) United States Patent
Aimi et al.

(10) Patent No.: US 8,638,093 B2
(45) Date of Patent: Jan. 28, 2014

(54) SYSTEMS AND METHODS FOR ENHANCING RELIABILITY OF MEMS DEVICES

(75) Inventors: Marco Francesco Aimi, Niskayuna, NY (US); Joseph Alfred Iannotti, Glenville, NY (US); Christopher Fred Keimel, Schenectady, NY (US); Steven YueHin Go, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 322 days.

(21) Appl. No.: 13/077,704

(22) Filed: Mar. 31, 2011

(65) Prior Publication Data

US 2012/0249261 A1    Oct. 4, 2012

(51) Int. Cl.
G01V 3/00    (2006.01)
(52) U.S. Cl.
USPC .......................................... 324/300; 324/311
(58) Field of Classification Search
USPC ........................... 324/300–322; 600/407–445
See application file for complete search history.

(56) References Cited

U.S. PATENT DOCUMENTS

| 6,998,851 | B2 | 2/2006 | Van Spengen |
| 7,675,383 | B2 | 3/2010 | Hangai et al. |
| 7,679,872 | B2 | 3/2010 | Kawa et al. |
| 8,216,173 | B2 * | 7/2012 | Dacey et al. ...................... 604/8 |
| 8,280,484 | B2 * | 10/2012 | Boyden et al. ................. 600/407 |
| 8,414,517 | B2 * | 4/2013 | Dacey et al. ...................... 604/8 |
| 8,460,229 | B2 * | 6/2013 | Dacey et al. ...................... 604/8 |
| 2009/0281412 | A1 * | 11/2009 | Boyden et al. ................. 600/407 |
| 2011/0160681 | A1 * | 6/2011 | Dacey et al. .................. 604/265 |

* cited by examiner

*Primary Examiner* — Brij Shrivastav
(74) *Attorney, Agent, or Firm* — Jenifer E. Haeckl

(57) ABSTRACT

A micro-electromechanical system (MEMS) device that in one embodiment includes at least two MEMS switches coupled to each other in a back-to-back configuration. The first and second suspended elements corresponding to first and second MEMS switches are electrically coupled. Further, first and second contacts corresponding to the first and second MEMS switches are configured such that a differential voltage between the second suspended element and the second contact is approximately equal to a differential voltage between the first suspended element and the first contact. The MEMS device includes at least one actuator coupled to one or more of the first and second suspended elements to actuate one or more of the first and the second suspended elements. In one example, the MEMS device includes one or more passive elements coupled to one or more of the first and second MEMS switches.

20 Claims, 4 Drawing Sheets

SYSTEMS AND METHODS FOR ENHANCING RELIABILITY OF MEMS DEVICES

BACKGROUND

Embodiments of the present technique relate generally to switching devices, and more particularly to methods and systems for enhancing performance of micro-electromechanical systems (MEMS).

MEMS are electromechanical devices that generally range in size from a micrometer to a millimeter in a miniature sealed package. The near zero power consumption, small size, high isolation, switching speeds, linearity, low distortion and low insertion losses achievable by MEMS devices make them ideal for implementation in a plurality of application spaces. Accordingly, MEMS devices find wide usage, for example, in pressure sensors, actuators, displays, gyroscopes, bio sensors and various radio frequency (RF) transmission circuits.

A conventional MEMS device in the form of a microswitch may include a movable actuator, such as a cantilever beam that moves towards a stationary electrical contact. Particularly, the movable actuator moves under the influence of a gate driver typically positioned on a substrate below the movable actuator. To that end, the gate driver employs electrostatic, magneto-static, piezoelectric and/or thermal designs for providing actuation forces that facilitate the movement of a free end of the movable actuator towards the stationary contact to complete the electrical circuit.

The extremely high isolation and the extremely low "on-resistance" of the MEMS switch, however, cause a dramatic change of state while opening or closing the MEMS switch. Such sharp electrical transitions may cause a transfer of energy across the contacts causing damage or failure of the MEMS switch, which in turn, degrades the system performance. Accordingly, to mitigate such conditions, certain approaches describe the use of power diverters and active circuits for reducing the energy that couples across the MEMS contacts during opening or closing of the MEMS switch. Such approaches, however, are typically expensive and may not be suitable for certain application environments.

Another mitigation technique employs specific circuit configurations that temporarily bypass the current into a secondary electrical path. Such a technique, although useful when opening the MEMS switch into flowing current, may not be appropriate for use in applications where only a limited current is available during the opening and closing of the switch. By way of an example, in receiving and transmitting circuits for devices such as magnetic resonance (MR) coils of a Magnetic Resonance Imaging (MRI) system, the voltage across a switch is drastically reduced as the transmit pulse is off during the operation of the switch. The surrounding gradient fields in the MR system, however, may induce voltages on the MR coils due to magnetic and electrostatic coupling. Accordingly, the gradient fields may cause voltages, for example, of about 1 Volt (V) to appear across contacts of the MEMS switch. Switching in an out of such voltages stresses the MEMS switch, often leading to damage or failure of the MEMS switch and/or the MR system.

It is desirable to develop methods and systems that greatly improve the MEMS reliability by reducing the energy coupled across the contacts during opening and closing of the MEMS switch. Additionally, there is a need for MEMS switch configurations that provide high isolation, yet prevent self-actuation or failure especially in application environments prone to strong electromagnetic fields, voltage and current surges, and fast transients.

BRIEF DESCRIPTION

In accordance with aspects of the present system, a micro-electromechanical system (MEMS) device is disclosed. The MEMS device includes at least two MEMS switches coupled to each other in a back-to-back configuration. To that end, a first suspended element corresponding to the first MEMS switch is coupled to a second suspended element corresponding to the second MEMS switch. Further, a first contact corresponding to the first MEMS switch and a second contact corresponding to the second MEMS switch are configured such that a differential voltage between the second suspended element and the second contact is approximately equal to a differential voltage between the first suspended element and the first contact. Further, the MEMS device includes at least one actuator coupled to one or more of the first suspended element and the second suspended element to actuate one or more of the first suspended element and the second suspended element. Additionally, the MEMS device includes one or more passive elements coupled to one or more of the first and second MEMS switches, wherein the one or more passive elements reduce energy transfer during state transition of the MEMS device.

In accordance with another aspect of the present system, a MEMS device coupled to at least one transmit and receive circuit is presented. The MEMS device includes at least two MEMS switches coupled to each other in a back-to-back configuration, where the impedance of the MEMS device varies as a function of frequency. The MEMS device further includes one or more passive elements coupled to at least one of the MEMS switches to receive a transfer of electrical energy from the at least one of the MEMS switches during state transition of the MEMS device.

In accordance with further aspects of the present technique, a method of improving reliability of a MEMS device in a transmit and receive circuit is described. The method includes coupling a plurality of MEMS switches to each other in a back-to-back configuration. Further, one or more one or more passive elements are provided. Additionally, the one or more passive elements are coupled to at least one of the plurality of MEMS switches to receive a transfer of electrical energy from the at least one of the plurality of MEMS switches during state transition of at least one of the plurality of MEMS switches.

DRAWINGS

These and other features, aspects, and advantages of the present technique will become better understood when the following detailed description is read with reference to the accompanying drawings in which like characters represent like parts throughout the drawings, wherein:

FIG. 1*a* is a schematic diagram illustrating an embodiment of an MR system including a MEMS device coupled to one or more MR coils, in accordance with aspects of the present technique;

FIG. 1*b* is a schematic diagram illustrating one embodiment of a MEMS switch coupled to a passive bypass circuit, in accordance with aspects of the present technique;

Figure 4:
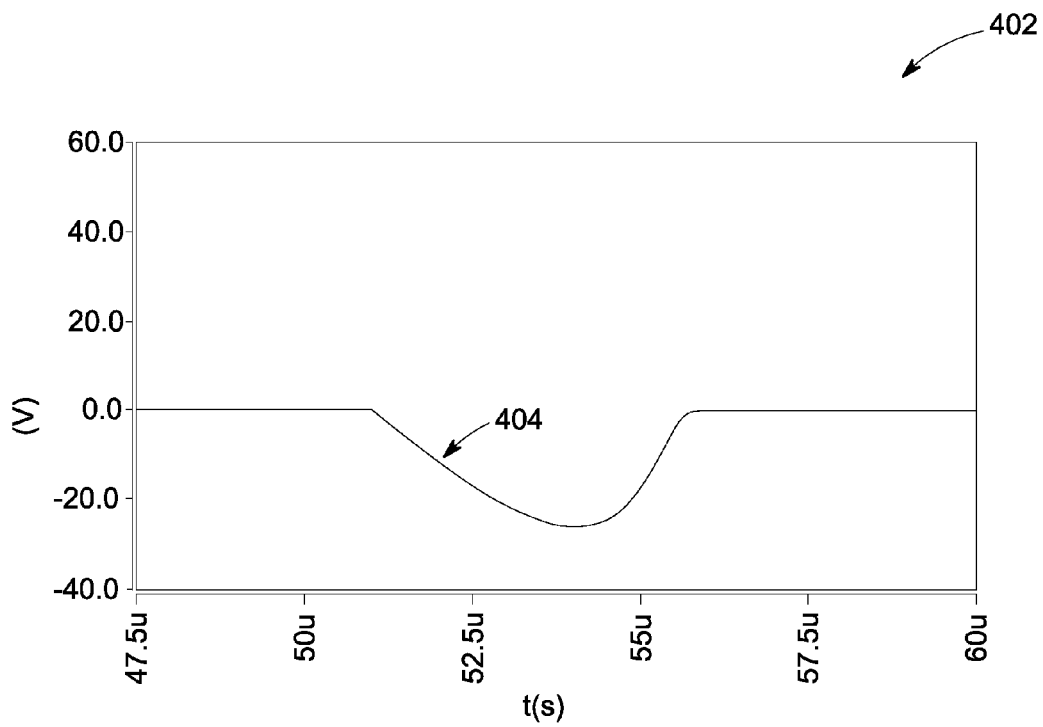
Figure 5:
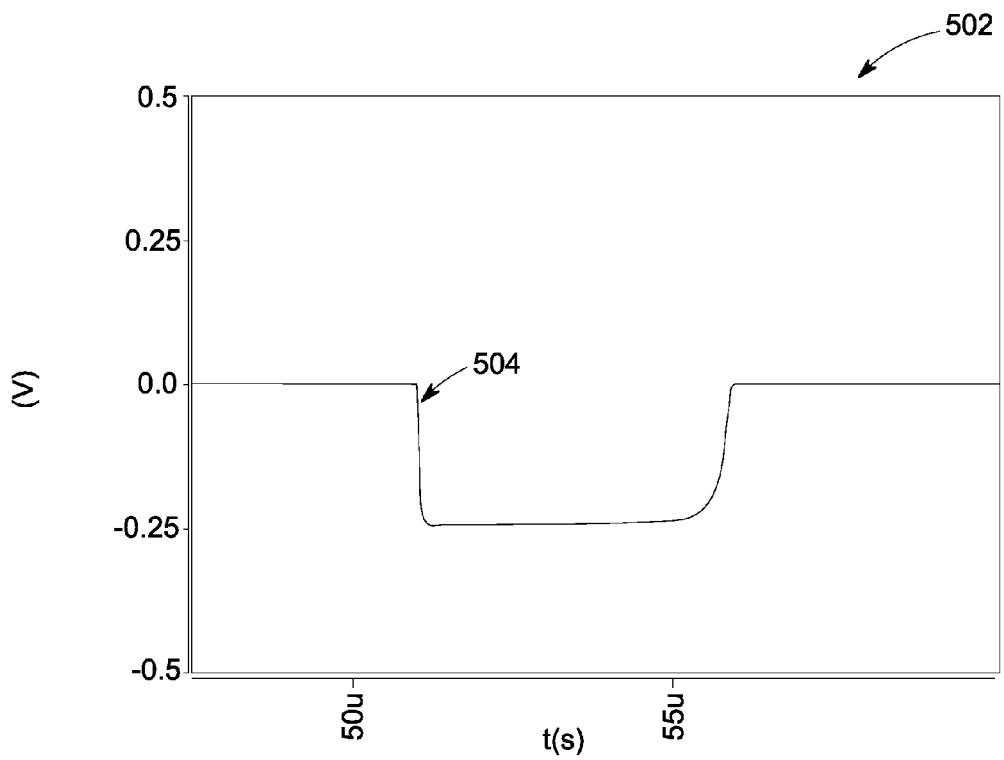

FIG. 4 is a graphical representation depicting a voltage induced during the closing of an embodiment of the MEMS switch configured in the back-to-back configuration, in accordance with aspects of the present technique; and FIG. 5 is a graphical representation depicting a voltage induced during the closing of another embodiment of the MEMS switch including a passive element in addition to being configured in the back-to-back configuration, in accordance with aspects of the present technique.

DETAILED DESCRIPTION

The following description presents systems and methods for improving MEMS performance and reliability. Particularly, certain embodiments illustrated herein describe exemplary MEMS switch configurations for use in transmit and receive circuits such as MR systems. Although the following description presents the claimed MEMS configurations in the context of MR imaging, the present technique may be implemented in various other circuits and systems to achieve high isolation, while preventing self-actuation or failure by reducing the energy coupled across the contacts during opening and closing of the MEMS switch. By way of example, the present technique may be implemented in other switching applications involving transmitting and receiving devices such as mobile telephones, magnetic resonance spectroscopy (MRS), computed tomography (CT), and radio communications. An exemplary environment that is suitable for practicing various implementations of the present systems and techniques is described in the following section with reference to FIG. 1a.

Figure 1A:
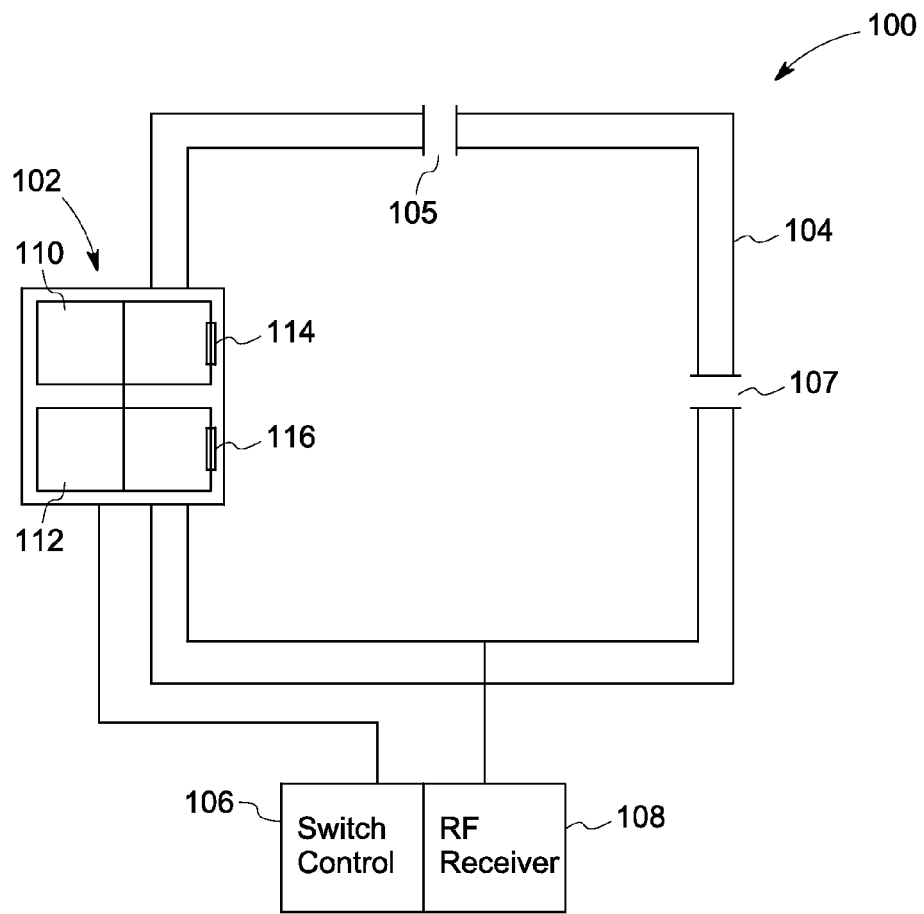

FIG. 1a illustrates an MR system 100 including a MEMS device 102 coupled to an MR coil 104. In one embodiment, the MR coil 104 includes, for example, a radio frequency (RF) transmit coil and/or an RF receive (surface) coil that operates at one or more frequencies in the MR system 100. Although FIG. 1a illustrates a single MR coil 104, in certain embodiments, the MR coil 104 may be implemented as an array of MR coils having one or more coil elements to provide single or multiple frequency MR operations. Further, in certain embodiments, the MR coil 104 includes one or more capacitors 105, 107 and/or one or more inductors (not shown) in a loop. Typically, the capacitance of the capacitors 105, 107 influences the resonant frequency of the MR coil 104. Accordingly, in one exemplary implementation, the capacitors 105, 107 have a resonant frequency tuned to about 64 MHz or about 128 MHz depending on the intensity of a corresponding magnetic field in the MR system 100. Additionally, the MEMS device 102 includes one or more MEMS switches coupled to the MR coil 104 at one or more desirable positions, for example, next to one of the capacitors 105, 107 in the MR coil 104 to allow switching to isolate the MR coil 104.

Accordingly, in an embodiment where the MR coil 104 is operating in a receive RF coil configuration, the MEMS device 102 may be in an open state during a transmit operation and a closed state during the receive operation. In alternative embodiments, however, the specific state of the MEMS device 102 and the corresponding switching operations may depend upon the specific circuit design and/or application requirements. To that end, the MR system 100 may include a switch control 106 that switches the MEMS device 102 between open and closed states based on the specific requirements.

By way of example, during the transmit operation, the switch control 106 may switch the MEMS device 102 to the open state to decouple the MR coil 104 from an RF receiver 108 before selective application of RF transmit signals to a patient. Further, during the receive operation, the switch control 106 switches the MEMS device 102 to the closed state for coupling the MR coil 104 to the RF receiver 108 to enable detection of the MR signals corresponding to the resulting excitation in the patient. The detected MR signals, in turn, may be communicated to a processing system (not shown) coupled to the MR system 100 for further processing, image reconstruction and/or display. The MEMS device 102, thus, is integrated into the MR system 100 for efficiently decoupling RF transmit and/or receive coils during MR transmit and/or receive operations.

Inclusion of a conventional MEMS switch within the MR system 100, however, may cause serious voltage-coupling issues. Particularly, during the transmit operation, the MEMS switch itself may act as a small capacitance added in series with the capacitors (not shown) corresponding to the MR coil 104. This small capacitance along with any extra resistances included in the MEMS switch for preventing magnetic distortion may cause coupling of voltages, for example of the order of about 1 volt (V), across the contacts of the MEMS switch 102. Switching in an out of such voltages may result in damage or failure of the MEMS device 102 and/or the MR system 100.

Accordingly, in one embodiment, the MEMS device 102 includes at least two MEMS switches 110, 112 coupled together in a "back-to-back" configuration. As used herein, the term "back-to-back" refers to specific MEMS configurations in which the respective actuating elements (not shown) of the MEMS switches 110, 112 are coupled together at corresponding anchors and a gate. In one example, the back-to-back MEMS are configured such that the actuating elements are mechanically coupled to each other. In a further example, a single anchor is used to support the actuating elements of the back-to-back MEMS switches. In certain embodiments, the MEMS device 102 further includes one or more passive elements 114, 116 to impart additional protection to the MEMS switches 110, 112. To that end, the one or more passive elements 114, 116 may be respectively coupled in parallel across the MEMS switches 110, 112. Particularly, the one or more passive elements 114, 116 protect the MEMS switches 110, 112 by receiving at least a portion of electrical energy transferred across the contacts of the MEMS switches 110, 112 during state transition.

In certain embodiments, the MEMS device 102 further includes one or more passive elements 114, 116 to impart additional protection to the MEMS switches 110, 112. To that end, the one or more passive elements 114, 116 may be respectively coupled in parallel across the MEMS switches 110, 112. Particularly, the one or more passive elements 114, 116 protect the MEMS switches 110, 112 by receiving at least a portion of electrical energy transferred across the contacts of the MEMS switches 110, 112 during state transition.

The embodiment of the MEMS device 102 illustrated in FIG. 1a, thus alleviates "hot switching" and improves reliability of the MEMS device, specifically when switched in the presence of a high power signal. An exemplary configuration of the MEMS device that provides reliable performance even while operating in a high isolation environment is described in greater detail with reference to FIG. 2.

Figure 1B:
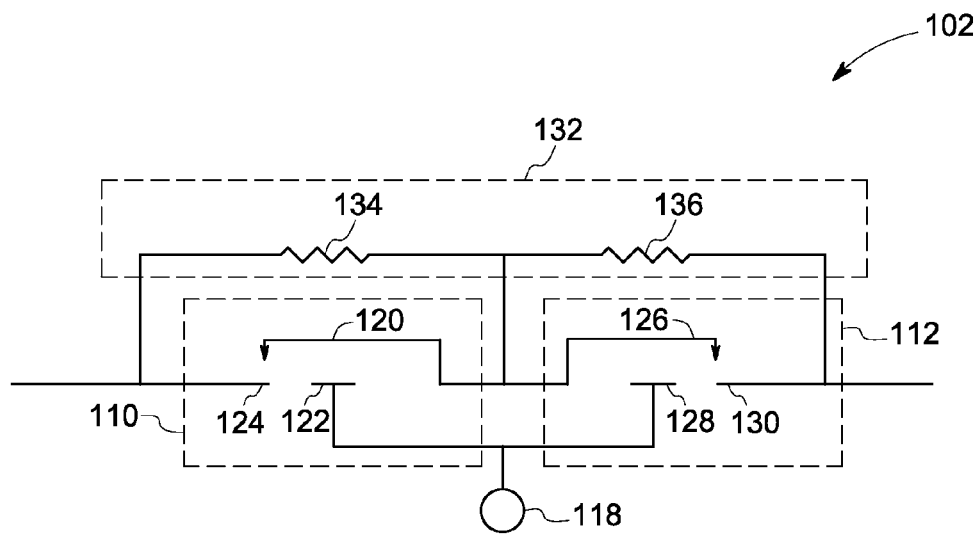

Referring to FIG. 1b, one example of a back-to-back MEMS configuration is depicted. In this example, the MEMS device 102 includes a single driver 150 that controls the first MEMS switch 155 and the second MEMS switch 160. The first and second MEMS switch 155, 160 is electrically coupled to a passive bypass circuit 180. The first MEMS switch 155 includes a first beam element 156 that is influenced by the first gate 157 to make a connection between the first beam element 156 and the first contact 159. The second MEMS switch 160 includes a second beam element 161 that is influenced by the second gate 162 to make a connection between the second beam element 161 and the second contact 164. The first MEMS switch 155 and second MEMS switch in this example are coupled to a passive bypass circuit 180 that consists of two passive elements each coupled to respective MEMS switches 155, 160. In this example, the passive bypass circuit 180 includes a first resistor 182 for the first MEMS switch 155 and a second resistor 184 for the second MEMS switch 160. It should be understood that the passive elements in the passive bypass circuit in this example are resistive elements 182, 184 however other passive elements include inductors.

The passive bypass circuit 180 protects the MEMS switches 155, 160 by receiving at least a portion of electrical energy transferred across the contacts of the MEMS switches 155, 160 during state transition. The passive elements 182, 184 do not change state when the MEMS switches 155, 160 are operated and are thus independent of the switch state.

Figure 2:
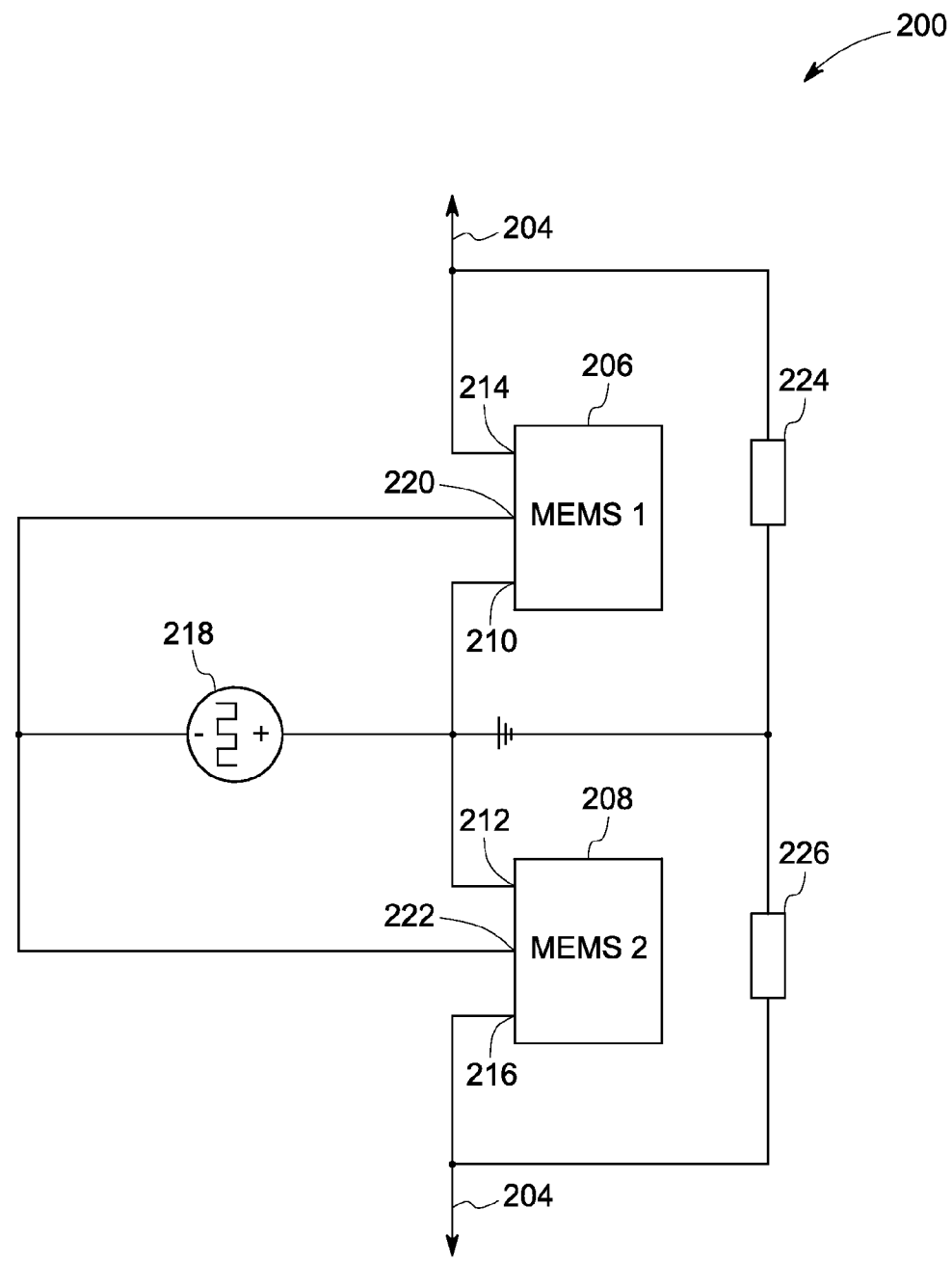
FIG. 2 is a schematic diagram depicting an exemplary configuration of a MEMS device, in accordance with aspects of the present technique.

FIG. 2 illustrates a schematic representation 200 of an exemplary configuration of a MEMS device 202, similar to the MEMS device 102 of FIG. 1, for use in a transmit-receive system operating in a high isolation configuration. For purposes of description, the present embodiment describes the use of the MEMS device 202 as a switching subsystem in an MR system (not shown) such as the MR system 100 of FIG. 1. Accordingly, FIG. 2 illustrates the MEMS device 202 integrated with an MR coil 204. Particularly, the MEMS device 202 is integrated with the MR coil 204 to enable switching control for isolating the MR coil 204 during MR transmit or receive operations. Accordingly, the MR coil 204 may include, for example, one or more radio frequency (RF) transmit coils and/or RF receive coils that operate at one or more frequencies in the MR system.

As previously noted, a conventional MEMS switch in the open state may effectively act as a small capacitance when coupled to MR coils. This small capacitance reduces the maximum current in the MR coil 204 below a desirable maximum coil current value, for example, of about 150 milliamperes (mA). Further, certain conventional MEMS switch configurations include extra resistance for ensuring a distributed resistance value across different sections of the MEMS circuit, in turn, preventing distortion of the magnetic field. Use of such conventional MEMS switch configurations instead of the presently contemplated design of the MEMS device 202, however, may result in voltage coupling issues resulting in a reduction of the sustainable standoff voltage of the conventional MEMS switch.

Accordingly, to alleviate the problems of the conventional designs, in one embodiment, the MEMS device 202 is implemented as a pair of MEMS switches 206 and 208 coupled to each other in a back-to-back configuration. As previously noted, the back-to-back configuration corresponds to an arrangement of at least two MEMS switches coupled together so as to allow sharing of the actuation voltage. Although FIG. 2 illustrates only a single pair of MEMS switches 206 and 208 coupled together in a series configuration, the specific number of MEMS switches may vary based on application requirements. By way of example, in a magnetic or RF environment, the number of MEMS switches may be determined based on a corresponding voltage pulse effect to prevent self-actuation due to the MR RF signals. Further, the MEMS switches may be connected in series, parallel or series-parallel configuration and/or in a MEMS array based on the specific circuit design and/or end-use application.

In one embodiment, when coupled together in the back-to-back configuration, the MEMS device 202 includes a first suspended element or a first beam 210 corresponding to the MEMS switch 206 electrically coupled to a second suspended element or a second beam 212 corresponding to the MEMS switch 208. In one embodiment, the first and the second beams 210, 212 may be physically separate and may comprise a conductive material or alloy. In an alternative embodiment, however, the first and second beams 210, 212 may be integrally formed as opposite ends of actuating elements that share the same anchor region, thus eliminating any external connections and reducing the overall inductance of the MEMS device 202. Accordingly, in certain embodiments, the MEMS device 202 includes one or more anchors (not shown) that support and mechanically couple the first and the second beams 210, 212 to an underlying substrate (not shown) that supports the MEMS switches 206, 208.

Further, the first and the second beams 210, 212 corresponding to the first and second MEMS switches 206, 208, respectively, may be actuated individually or simultaneously to make electrical contact with a first contact 214 and a second contact 216, respectively. In one embodiment, the first contact 214 operates as a source or an input contact and the second contact 216 operates as a drain or an output contact. Additionally, the first and the second contacts 214, 216 may be electrically coupled as part of a load circuit (not shown) in which the first and the second beams 210, 212 function to pass electrical current from the first contact 214 to the second contact 216 upon actuation of the MEMS switches 206, 208.

To that end, the MEMS device 202 includes an actuator (gate driver) 216 coupled to the first beam 210 and/or the second beam 212 to actuate the first beam 210 and/or the second beam 212. Particularly, in one embodiment, the pair of MEMS switches 206, 208 are powered by the single gate driver 218 that imparts an actuation force to the first and the second beams 210, 212. By way of example, the gate driver 218 may impart electrostatic, magneto-static and/or piezoelectric forces to facilitate the movement of free ends of the first and the second beams 210, 212 towards the first and the second contacts 214, 216 to complete the electrical circuit.

Accordingly, in certain embodiments, the gate driver 218 may include power supply and control logic inputs for changing the actuation states of the MEMS switches 206, 208 based on application requirements. Further, the gating voltage may be referenced to the first and the second beams 210, 212 such that a differential voltage between the second beam 212 and the second contact 216 is substantially equal to a differential voltage between the first beam 210 and the first contact 214.

Specifically, in one embodiment, the symmetry of the back-to-back configuration allows sharing of the total voltage across the MEMS switches 206 and 208 such that the voltage between either of the beams 210, 212 and the corresponding gate terminals 220, 222 is only about half of the total voltage. Specifically, the symmetry of the back-to-back configuration allows for a capacitance of the gate terminal 220 to the contact 214 of the first MEMS switch 206 is substantially matched to the capacitance from the gate terminal 222 to the contact 216 of the second MEMS switch 208. The capacitance matching, in turn, results in the voltage at the gate terminals 220, 222 to be consistent with the voltage at the beams 210, 212 resulting in no or negligible voltage coupling across the MEMS switched 206, 208. By way of example, if a voltage of 200 V is placed across the first and the second contacts 214, 216 and a switch reference is graded to 100 V, the voltage between the first contact 214 and the first beam 210 and the second contact 216 and the second beam 212 would only be about 100 V.

In certain embodiments, however, the capacitance between the two halves of the MEMS device 202 may not be substantially equal leading to some acceptable tolerance. In such embodiments, the acceptable tolerance values depend upon the allowable voltage that can appear at the gate terminals 220, 222, the overall asymmetry of the gate terminals 220, 222 to contacts 214, 216, and beams 210, 212 to contacts 214, 216 and the standoff voltage and the frequency of the MR system. Accordingly, in an exemplary MR application, where a voltage across a MEMS switch array can be about 500V, an asymmetry of about 20% would be required to impart a voltage of about 100 V on the gate terminals 220, 222 for self-actuation of the MEMS device 202.

The symmetry of the back-to-back configuration, thus, allows a large standoff voltage that may otherwise surpass the standoff voltage of a conventional MEMS switch to be divided substantially equally or in a desired proportion between the first and the second beams 210, 212 to protect the MEMS device 202. In certain embodiments, the MEMS device 202 is further protected by including the first and second beams 210, 212 within a single cap or covering (not shown) to increase the standoff voltage of the MEMS switches 206, 208 without substantially increasing the switch footprint.

The MEMS switches 206, 208, thus provide reliable performance to the MR system in the back-to-back configuration. As previously noted, the MEMS switches 206, 208 may be in an open state during a transmit pulse sequence and in a closed state during the receive pulse sequence. Accordingly, the MEMS switches 206, 208 provide low on-resistance (such as less than about 0.1 ohm in a parallel array) and high off-isolation (such as less than about 500 femto farad (fF)) during the MR receive and transmit operations. The high off isolation and the low on-resistance of the MEMS switches 206, 208 provide a good signal-to-noise ratio for the MR coil 204 during the receive pulse sequence, while reducing stray current in the MR coil 204 during the transmit pulse sequence.

The high off-isolation and the low on-resistance, however, cause a dramatic change of state between an open and a closed state of the MEMS switches 206, 208. Particularly, in certain exemplary implementations, the MEMS switches 206, 208 may experience a significant voltage kick during such electrical transition due to the capacitive coupling from the gate driver 218. When integrated within the MR coil 204, typical voltages across the MEMS switches 206, 208 during the transmit pulse may be of the order of about 200 V. The transmit pulse, however, is off during the opening and closing of the MEMS switches 206, 208 resulting in a drastic reduction of the voltage on the MEMS switches 206, 208.

Ideally, if the transmit pulse is off during the opening and closing of the MEMS switches 206, 208, there would be no voltage or stored energy across the MEMS switches 206, 208 on closing. In the MR system implementation, however, gradient fields (not shown) surrounding the MR coil 204 can induce voltages on the MR coil 204 due to magnetic and electrostatic coupling. Specifically, these gradient fields may cause stray voltages, for example, of the order of about 1 V to appear across the first and second contacts 214, 216 of the MEMS switches 206, 208. Switching in and out of voltages of this order may stress or otherwise cause damage to the MEMS switches 206, 208.

In one embodiment, coupling of such stray voltages may be prevented or mitigated by optimizing the impedance of the MEMS switches 206, 208 to not only enable high isolation during the transmit pulse, but also offer a leakage path for the gradient fields. In the MR system, however, the frequency corresponding to the transmit pulse is either about 64 or 128 MHz depending of the magnitude of the magnetic field, while the frequency of the gradient field is of the order of 10's to 100 kHz. Accordingly, to maintain high isolation across the MEMS switches 206, 208 at high frequency, the corresponding capacitance still needs to remain small.

To that end, in one embodiment, the MEMS device 202 includes one or more passive elements 224, 226 respectively coupled to the MEMS switches 206, 208. Unlike the use of protective active circuits in conventional MEMS switches, the passive elements 224, 226 do not employ any power or control signals for bypassing the energy the coupled across the MEMS switches 206, 208 during MEMS state transition. Further, in certain embodiments, the impedance of the passive elements 224, 226 is smaller than the impedance of the MEMS switches 206, 208 when open at low frequencies and is higher than the impedance of the MEMS switches 206, 208 at high frequencies. In one example, the threshold frequency is about 10 MHz and the passive elements are employed such that at high frequencies such as those greater than about 10 MHz, the impedance of the passive elements 224, 226 is higher than the impedance of the MEMS switches 206, 208. Similarly, the passive elements are employed such that at frequencies lower than about 10 MHz, the impedance of the passive elements 224, 226 is lower than the impedance of the MEMS switches 206, 208.

Accordingly, the passive elements 224, 226 may include, for example, one or more inductors and/or resistors coupled to the MEMS switches 206, 208 in a series and/or a parallel configuration to provide high isolation at high frequency values and a leakage path at low frequency values. The resistors can be advantageously used as the passive elements 224, 226 since the corresponding parasitic capacitance does not influence the RF blocking performance of the MEMS device 202. Similarly, the inductors may be advantageously used as the passive elements 224, 226 in the MR system because the inductors do not have cores that can saturate in the magnetic field of the MR system. Further, in certain embodiments, specific characteristics of the passive elements 224, 226 such as shape, size, material, and/or magnetic characteristics may be selected based on one or more parameters corresponding to the MEMS device 202 and/or the MR system. By way of example, the one or more parameters may include peak voltage, peak current, desired voltage rating, parasitic capacitance, size, proximity to the switching elements and energy absorption characteristics corresponding to the MEMS device and/or the MR coil 204.

Generally, the MR coil 204 includes high quality factor loops that include capacitive breaks, such as those provided by the capacitors 105, 107 of FIG. 1, across sections of the MR coil 204. These capacitors may allow coupling of stray voltages across the MR coil 204 at low frequency, for example, below the threshold frequency, even when the transmit pulse is off. The possibility of coupling of stray voltages is further enhanced due to the very low capacitance (for example, about 300 fF) and the very low leakage currents (for example, <1 pico amp (pA)) of the MEMS switches 206, 208.

Accordingly, in one embodiment, the passive elements 224, 226 include one or more inductors that act across the MEMS switches 206, 208 coupled to the MR coil 204. The impedance of these inductive passive elements 224, 226 increases with increasing frequency during MR operation, thus causing greater isolation across the MEMS device 202. During low frequency MR operations, however, the inductive passive elements 224, 226 act as "shorts" operating at a lowering impedance relative to the MEMS switches 202 allowing for the low frequency components of the RF signal to be "shorted" across the inductive passive elements 224, 226. The inductive passive elements 224, 226, thus prevent stray voltages from appearing across the MEMS switches 206, 208 during closing. Specifically, the inductive passive elements 224, 226 eliminate direct current (DC) voltage across the MEMS switches 206, 208 when taken to either extreme of the desired frequency range, for example, corresponding to MR operations or while switching broadband electrical signals.

In an alternative embodiment, however, the passive elements 224, 226 include one or more resistors coupled to the MEMS switches 206, 208 in parallel as a bypass. To that end, the resistive passive elements 224, 226 may be sized such that the impedance at high frequency does not overwhelm the extremely low capacitance of the MEMS switches 206, 208, but effectively reduces the stray voltages at low frequency. By way of example, the resistive passive elements 224, 226 having a resistance of the order of 10's to 100's of kilo-Ohms are selected to match the effective resistance of the MEMS switches 206, 208 operating at a frequency of about 128 MHz. This additional resistance reduces coupling of stray voltages induced by the gradient field at a low frequency, thus protecting the MEMS switches 206, 208 from cyclical damage. Further, the resistive passive elements 224, 226 provide a non-magnetic and low cost option for optimizing the impedance of the MEMS device 202 in an RF environment such as when connected to the MR coil 204.

Inclusion of the passive elements 224, 226 in the back-to-back configuration of the MEMS switches 206, 208, thus, reduces the cyclic damage. Particularly, in certain exemplary implementations, the presently contemplated configuration of the MEMS switches 206, 208 coupled in the back-to-back configuration and including passive elements was seen to provide a ten-fold improvement in the switching life cycle. An exemplary method for improving the reliability and the performance of the MEMS switches in accordance with aspects of the present technique is discussed in detail with reference to FIGS. 3-5.

Figure 3:
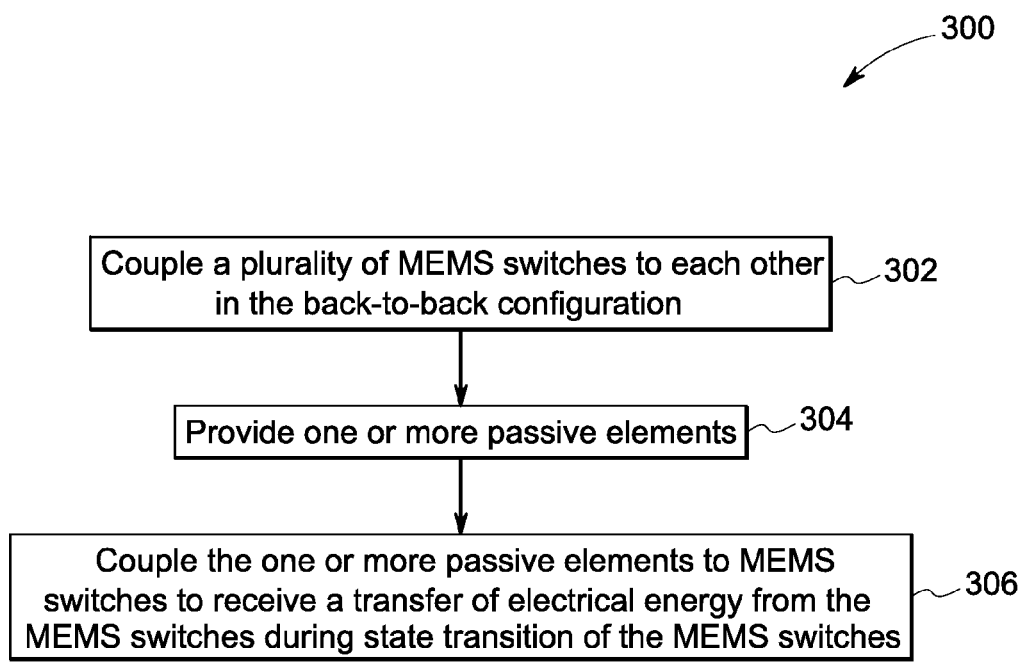
FIG. 3 is a flow chart depicting an exemplary method of improving reliability of a MEMS device, in accordance with aspects of the present technique.

Particularly, FIG. 3 illustrates a flow chart 300 depicting an exemplary method for improving reliability of a MEMS device, such as the MEMS device 102, 202 of FIGS. 1-2. Further, in FIG. 3, the exemplary method is illustrated as a collection of blocks in a logical flow chart. The various operations are depicted in the blocks to illustrate the functions that are performed generally during different phases of the exemplary method. The order in which the exemplary method is described is not intended to be construed as a limitation, and any number of the described blocks may be combined in any order to implement the exemplary method disclosed herein, or an equivalent alternative method. Additionally, certain blocks may be deleted from the exemplary method or augmented by additional blocks with added functionality without departing from the spirit and scope of the subject matter described herein. For discussion purposes, the exemplary method will be described with reference to the elements of FIG. 1.

Use of MEMS switches in RF applications allows for extremely low on-resistance and extremely high off-isolation resulting in high system performance. In accordance with aspects of the present technique, the performance of the MEMS switches within RF systems such as in an MR system may be further enhanced by employing MEMS switches in a back-to-back configuration and including one or more passive elements that optimize the corresponding impedance. Accordingly, at step 302, a plurality of MEMS switches, such as the MEMS switches 206, 208 of FIG. 2, are coupled to each other in a back-to-back configuration having a shared gate voltage. To that end, the MEMS switches, in one embodiment, may comprise a single gate driver connected to at least a first and a second suspended element (first and second beam). Alternative embodiments, however, may include more than a single gate driver coupled to the MEMS switches. The gate driver includes, for example, a square-wave voltage source that drives or biases the MEMS switches to actuate the first and/or the second beam towards a first or a second contact so as to establish an electrical path through the MEMS switches.

Accordingly, in one embodiment, a positive contact of the gate driver is connected through a resistor to the beam terminal of each of the MEMS switches. Further, a negative contact of the gate driver is connected through another resistor to a gate terminal of each of the MEMS switches. The MEMS switches, thus coupled together in a common gate configuration is employed in an MR system via a connection to one or more MR coils, such as the MR coil 204 of FIG. 2 to provide reliable switching performance.

By way of illustration, when integrated within the MR coils, typical voltages across the MEMS switches during the transmit pulse may be of the order of about 200 V. The symmetry of the back-to-back configuration allows for sharing of this voltage between the first and the second beams during the transmit operation. The transmit pulse, however, may be "off" during the opening and closing of the MEMS switches resulting in a drastic reduction of the voltage on the MEMS switches. Although, ideally no energy would be stored across the MR coils when the transmit pulse is off, however in practicality, the gradient fields surrounding the MR coils may induce voltages on the MR coils due to capacitive coupling. Particularly, the MEMS switches may experience a significant voltage kick during such electrical transition leading to stress, damage, or failure of the MEMS switches.

Accordingly, at step 304, one or more passive elements are provided as a bypass across the MEMS switches. Particularly, the one or more passive elements are chosen such that the impedance of the passive elements varies as a function of the frequency of MR operations. To that end, the one or more passive elements include, for example, an inductor, a resistor and/or a capacitor. Further, one or more characteristics of the passive elements may be selected based on one or more parameters such as peak voltage, peak current, desired voltage rating, parasitic capacitance, size, proximity to the switching elements and energy absorption characteristics corresponding to the MEMS switches and/or the MR system. Particularly, the specific characteristics of the passive elements may be customized such that the impedance at high frequency does not overwhelm the extremely low capacitance of the MEMS switches, but effectively reduces the energy coupling across the MEMS switches at low frequency. By way of example, a resistor/inductor having an impedance of 50 kOhms at the frequencies of interest may be selected to operate as a bypass across the MEMS switches.

At step 306, the selected passive elements are coupled to at least one of the plurality of MEMS switches to receive a transfer of electrical energy when the MEMS switches change from the closed state to an open state or vice versa. Specifically, in one embodiment, the passive elements are coupled across the MEMS switches in a series configuration to receive at least a portion of energy coupled across the MEMS switch on closing. During high frequency transmit operation, the impedance of the passive elements may increase with the increase in the operating frequency causing greater isolation across the MEMS switches. During low frequency receive operations, however, the passive elements allow shorting of the low frequency components of the signal across the passive elements.

Accordingly, the passive elements alleviate "hot-switching" by allowing the MEMS switch to be switched on into a lower power (or no power) state in which the reliability of the MEMS switch can be maintained. Further, in the embodiment describing the use of the resistive passive elements, the additional resistance corresponding to the passive elements significantly reduces coupling of energy across the MEMS switches during state transition, thus improving switching life cycle. Particularly, in an exemplary implementation employing the passive elements, the switching life cycle was improved by a factor of ten. Certain exemplary performance characteristics achieved by a MEMS switch when including a passive element in addition to being configured in the back-to-back configuration will be described in greater detail with reference to FIGS. 4 and 5.

As detailed herein, the capacitive coupling due to the transient fields in the MR system may induce a certain amount of voltage across the MEMS switches. FIG. 4 illustrates another graphical representation 402 depicting a simulated voltage 404 induced during the closing of the MEMS switches without the benefit of the passive elements. In the simulated sequence, the gate voltage was ramped up to about 120V over a 5 µsec duration for closing the MEMS switches. Such a gate voltage, however, may couple more than 20 V across the MEMS switches leading to stress or damage at switching contacts, thus degrading the life of the MEMS switches.

Accordingly, in the presently contemplated configuration of the MEMS device, such as illustrated in FIG. 2, one or more passive elements are coupled across the MEMS switches to receive a transfer of at least a portion of the coupling voltage generated across the MEMS switches on closing. Further, another exemplary cycle of an MR transmit and receive sequence, such as described with reference to FIG. 4, was used to simulate the operation of the MEMS switches that include one or more passive elements in addition to being configured in the back-to-back configuration when coupled to the MR coils.

Particularly, a resistor having a resistance of the order of 10's to 100's of kilo-Ohms was employed to match the effective resistance of the MEMS switches operating at a frequency of about 128 MHz. This additional resistance was shown to reduce the voltage coupling induced by the gradient field at lower frequency, thus protecting the MEMS switches from cyclical damage. Specifically, FIG. 5 illustrates the performance enhancements achieved by the inclusion of the resistor across the MEMS switches as a passive bypass element.

Further, FIG. 5 illustrates a graphical representation 502 depicting a voltage 504 induced during the closing of the MEMS switches including a passive element in addition to being coupled in the back-to-back configuration. Particularly, the graphical representation 502 depicts about a 100 times reduction in the voltage 504 induced on closing of the MEMS switch simply by the addition of the parallel resistor.

The systems and the methods disclosed hereinabove describe the use of a MEMS device in an RF environment with optimized impedance and reliability. To that end, the MEMS device includes a plurality of MEMS switches coupled in a back-to-back configuration and including one or more passive bypass elements. As evidenced by the graphical representations of FIG. 5 use of MEMS switches in the back-to-back configuration and the passive bypass elements significantly reduces the energy transfer across the MEMS switches during state transition, thus greatly enhancing the switching life cycle. Use of the present MEMS device, thus provides efficient switching performance, while enhancing the health and safety of the MR system.

Although exemplary embodiments of the present technique are described in the context of micron-sized MEMS devices in an MR system, it will be appreciated that use of the techniques and structures corresponding to the claimed MEMS devices in larger or smaller devices such as in nano-technology-based devices in other RF environments is also contemplated.

While only certain features of the present invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A micro-electromechanical system (MEMS) device, comprising:
   at least two MEMS switches coupled to each other in a back-to-back configuration;
   a first suspended element corresponding to the first MEMS switch electrically coupled to a second suspended element corresponding to the second MEMS switch;
   a first contact corresponding to the first MEMS switch and a second contact corresponding to the second MEMS switch configured such that a differential voltage between the second suspended element and the second contact is approximately equal to a differential voltage between the first suspended element and the first contact;
   at least one actuator coupled to one or more of the first suspended element and the second suspended element to actuate one or more of the first suspended element and the second suspended element; and
   one or more passive elements coupled to one or more of the first and second MEMS switches, wherein the one or more passive elements are configured to reduce energy transfer during state transition of the MEMS device.

2. The MEMS device of claim 1, wherein the one or more passive elements comprise one or more inductors coupled to the MEMS device in parallel, one or more resistors coupled to the MEMS device in parallel, or combinations thereof.

3. The MEMS device of claim 1, wherein the one or more passive elements comprise one or more inductors coupled to the MEMS device in parallel.

4. The MEMS device of claim 1, wherein the one or more passive elements comprise one or more resistors coupled to the MEMS device in parallel.

5. The MEMS device of claim 1, wherein one or more characteristics corresponding to the one or more passive elements are selected based on peak voltage, peak current, desired voltage rating, energy absorption characteristics, magnetic characteristics, parasitic effects or combinations thereof, corresponding to the MEMS device.

6. The MEMS device of claim 5, wherein the one or more characteristics corresponding to the one or more passive elements comprise shape, size, material, or combinations thereof.

7. The MEMS device of claim 1 coupled to one or more of transmit and receive circuits, magnetic resonance (MR) coils, a high isolation environment and a radio-frequency blocking path, wherein the impedance of the MEMS device varies as a function of a corresponding frequency.

8. The MEMS device of claim 7, wherein the one or more MR coils are receive coils, transmit coils, or a combination thereof.

9. The MEMS device of claim 1, wherein the one or more passive elements are coupled to one or more of the first suspended element, the first contact, the second suspended element and the second contact such that the one or more passive elements is configured to increase an impedance relative to the MEMS switches for radio frequency components at high frequency values and to decrease an impedance relative to the MEMS switches for the radio frequency components at low frequency values.

10. The MEMS device of claim 1, wherein the first contact is electrically coupled to the first suspended element and the second contact is electrically coupled to the second suspended element when actuated by the actuator.

11. A micro-electromechanical system (MEMS) device, comprising:
   at least two MEMS switches coupled to each other in a back-to-back configuration, wherein the impedance of the MEMS device varies as a function of frequency, wherein the MEMS device is coupled to at least one transmit and receive circuit; and
   one or more passive elements coupled to at least one of the MEMS switches to receive a transfer of electrical energy from the at least one of the MEMS switches to reduce coupling of the electrical energy across the MEMS switches during state transition of the MEMS device.

12. The MEMS device of claim 11, wherein the transmit and receive circuit comprises transmit magnetic resonance (MR) coils, receive MR coils, or a combination thereof.

13. The MEMS device of claim 11, wherein one or more of the plurality of MEMS switches coupled to each other in a back-to-back configuration comprise:
   a first suspended element electrically coupled to a second suspended element;
   a first contact and a second contact configured such that a differential voltage between the second suspended element and the second contact is approximately equal to a differential voltage between the first suspended element and the first contact; and
   an actuator coupled to one or more of the first suspended element and the second suspended element to actuate one or more of the first suspended element and the second suspended element.

14. The MEMS device of claim 11, wherein the one or more passive elements are coupled to at least one of the plurality of MEMS switches such that the one or more passive elements is configured to increase an impedance relative to the MEMS switches for radio frequency components above a threshold frequency and one or more passive elements is configured to decrease an impedance relative to the MEMS switches for the radio frequency components below the threshold frequency.

15. A method of improving reliability of a MEMS device in a transmit and receive circuit, comprising:
   coupling a plurality of MEMS switches to each other in a back-to-back configuration;
   providing one or more passive elements; and
   coupling the one or more passive elements to at least one of the plurality of MEMS switches to receive a transfer of electrical energy from the at least one of the plurality of MEMS switches to reduce coupling of the electrical energy across the MEMS switches during state transition of at least one of the plurality of MEMS switches.

16. The method of claim 15, further comprising coupling the one or more passive elements to the one or more MEMS switches such that the one or more passive elements block radio frequency components above a threshold frequency and short the radio frequency components below the threshold frequency.

17. The method of claim 15, further comprising selecting one or more characteristics corresponding to the one or more passive elements based on peak voltage, peak current, desired voltage rating, energy absorption characteristics, or combinations thereof, corresponding to the MEMS switches, wherein the one or more characteristics comprise shape, size, material, magnetic characteristics, parasitic effects, or combinations thereof.

18. A micro-electromechanical system (MEMS) device, comprising:
   at least two MEMS switches electrically coupled to each other, wherein the MEMS switches are configured in a back-to-back configuration having a single anchor mechanically coupling actuator elements of the MEMS switches;
   a single gate driver electrically coupled to the MEMS switches to change a switch state of the MEMS switches; and
   a passive bypass circuit comprising a plurality of passive elements coupled to the MEMS switches, wherein one end of the passive elements is coupled to a contact of the respective MEMS switches and the other end of the passive elements is coupled to a beam of the respective MEMS switches, wherein the passive elements are configured to reduce energy transfer during the change of the switch state of the MEMS switches, and wherein the passive elements are independent of the switch state.

19. The MEMS device of claim 18, wherein the passive elements are resistors.

20. The MEMS device of claim 18, wherein the one or more passive elements comprise one or more inductors coupled to the MEMS device in parallel.

* * * * *